US007261914B2

United States Patent
Wei et al.

(10) Patent No.: US 7,261,914 B2
(45) Date of Patent: Aug. 28, 2007

(54) METHOD AND APPARATUS FOR FORMING A NITRIDE LAYER ON A BIOMEDICAL DEVICE

(75) Inventors: Ronghua Wei, San Antonio, TX (US); Thomas L. Booker, San Antonio, TX (US); Christopher Rincon, San Antonio, TX (US); James H. Arps, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 331 days.

(21) Appl. No.: 10/811,485

(22) Filed: Mar. 26, 2004

(65) Prior Publication Data

US 2004/0213891 A1    Oct. 28, 2004

Related U.S. Application Data

(60) Provisional application No. 60/499,564, filed on Sep. 2, 2003.

(51) Int. Cl.
*B05D 3/06* (2006.01)
(52) U.S. Cl. ............... 427/2.1; 427/2.24; 427/2.25; 427/2.28; 427/530; 427/566; 427/569
(58) Field of Classification Search ............... None
See application file for complete search history.

(56) References Cited

U.S. PATENT DOCUMENTS

| 4,968,006 A | 11/1990 | Oliver .................. 266/78 |
| 5,079,032 A | 1/1992 | Oliver .................. 427/38 |
| 5,289,831 A | 3/1994 | Bosley .................. 128/899 |
| 5,308,412 A | 5/1994 | Shetty et al. .............. 148/238 |
| 5,334,264 A * | 8/1994 | Meletis .................. 148/222 |
| 5,372,660 A | 12/1994 | Davidson et al. ........... 148/421 |
| 5,380,547 A | 1/1995 | Higgins ................... 427/2.26 |
| 5,383,934 A | 1/1995 | Armini et al. .............. 623/16 |
| 5,843,289 A | 12/1998 | Lee et al. ................ 204/192.3 |
| 5,855,950 A | 1/1999 | Bunker ................... 427/2.27 |
| 5,859,404 A | 1/1999 | Wei et al. .............. 219/121.43 |
| 5,980,974 A | 11/1999 | Armini et al. .............. 427/2.27 |
| 6,033,582 A | 3/2000 | Lee et al. ................. 216/37 |
| 6,306,175 B1 | 10/2001 | Dearnaley et al. ......... 623/23.11 |
| 6,395,327 B1 | 5/2002 | Shetty ..................... 427/2.26 |
| 6,402,901 B1 | 6/2002 | Baldwin et al. ......... 204/192.11 |
| 6,464,889 B1 | 10/2002 | Lee et al. ................. 216/37 |
| 6,491,800 B2 | 12/2002 | Kirkpatrick et al. ... 204/192.34 |
| 6,548,104 B2 | 4/2003 | Pappas .................... 427/2.26 |
| 6,582,470 B1 | 6/2003 | Lee et al. ................ 623/23.55 |

OTHER PUBLICATIONS

Bordji et al, Biomaterials, 17, pp. 929-940, 1996.*

* cited by examiner

*Primary Examiner*—Erma Cameron
(74) *Attorney, Agent, or Firm*—O'Keefe, Egan & Peterman

(57) ABSTRACT

This invention is a method of forming a nitride layer on at least one metal or metal alloy biomedical device, comprising: providing a vacuum chamber with at least one biomedical device positioned thereon on a worktable within the vacuum chamber; reducing the pressure in the vacuum chamber; introducing nitrogen into the vacuum chamber so that the pressure in the vacuum chamber is about 0.01 to about 10 milli-Torr; generating electrons within the vacuum chamber to form positively charged nitrogen ions; providing a negative bias to the worktable so that the positively charged nitrogen ions contact the biomedical devices under conditions such that a nitride layer forms on the at least one prosthetic device.

20 Claims, 1 Drawing Sheet

METHOD AND APPARATUS FOR FORMING A NITRIDE LAYER ON A BIOMEDICAL DEVICE

This application claims priority to U.S. provisional application Ser. No. 60/499,564, filed Sep. 2, 2003, incorporated herein by reference.

"This invention was made with government support under DAMD17-97-2-7016 awarded by the National Medical Technology Testbed sponsored by the Department of the Army. The government has certain rights in the invention."

BACKGROUND OF THE INVENTION

This invention pertains to a method with which biomedical devices such as artificial hip joints and knee joints are hardened to improve wear resistance and hence to prolong the prosthesis lifetime.

Prosthetic knee and hip replacements can fail due to generation of wear debris from both metal and polymeric components. This in turn possibly induces a series of tissue reactions, including phagocytosis. Over a given time period, the chemical reactions cause osteolysis—an attack on the bone supporting the stem of the implant. Degradation of the bone tissue supporting the artificial joint eventually requires surgical intervention with inherent risk and cost. For more than a decade, cobalt chrome and titanium alloy prosthetic knee and hip replacements have been treated by ion implantation to increase their wear resistance, suppress osteolysis, and extend the effective component life. In this process, a beam of energetic nitrogen ions is directed at the surface of the implant, the ions penetrate and react with the metal, forming hard nitride precipitates which can increase the hardness, fatigue life, and water compatibility of the load bearing surface. Although ion implantation alters surface properties, it is not a coating process. As a result, there is no dimensional increase, change in surface finish, or risk of material delamination to the work-piece.

However, two important issues arise with this technique. First, although ion implantation shows some improvement on wear, the life spans of such prostheses are still limited (on average about 8-10 years) due to the inherent physical limitations of the technique as well as overall implant design limitations. The depth of modification produced by conventional nitrogen implantation is only 0.1-0.2 micrometers at typical energies of 50-100 keV. This implanted layer is believed to be insufficient for prosthetic applications, particularly knee joints, where high load conditions are applied along with frequent motion. When this layer is worn away, the wear rate can increase significantly. Second, the cost of beam-ion implantation can be quite high because of the limited size of an ion beam (often only a few square centimeters in area) and the line-of-sight geometry. In order to treat a number of devices, the ion beam has to be scanned to cover all the workpieces. This increases the required processing time, and therefore the cost. In addition, components must be manipulated in such a way that the ion beam "paints" the critical 3-dimensional wear surfaces evenly. This also requires a long duration of processing. Furthermore, complex fixtures are required to perform these manipulations. Because of the limitations described above, and the relatively high capital investment in implantation facilities the current cost of ion implantation for orthopedics can be quite high.

SUMMARY OF THE INVENTION

This invention provides one or more solutions to the disadvantages and omissions discussed above. In this regard, this invention is a method by which the shortcomings of ion beam implantation can be overcome.

In one respect, this invention is a method of forming a nitride layer on at least one metal or metal alloy biomedical device, comprising: providing a vacuum chamber with at least one biomedical device positioned thereon on a worktable within the vacuum chamber; reducing the pressure in the vacuum chamber; introducing nitrogen into the vacuum chamber so that the pressure in the vacuum chamber is about 0.01 to about 10 milli-Torr; generating electrons within the vacuum chamber to form positively charged nitrogen ions; providing a negative bias to the worktable so that the positively charged nitrogen ions contact the biomedical devices under conditions such that a nitride layer forms on the at least one prosthetic device.

In another broad respect, this invention is an apparatus for forming a nitride layer of at least about 1 micron on a biomedical device, comprising: a vacuum chamber, at least one source of electrons, at least one nitrogen inlet, at least one worktable having a negative voltage bias, wherein the vacuum chamber contains nitrogen at a pressure of about 0.01 to about 10 milli-Torr.

In another broad respect, this invention is a biomedical device made of metal or metal alloy which comprises an outer nitride layer having a thickness of at least 1 micron.

This invention is a high intensity plasma ion nitriding (HIPIN) process that is employed to accomplish the hardening of biomedical (prosthetic) devices to both prolong their lifetimes and to reduce the cost. By using this method, an intense nitrogen plasma can surround and bombard the devices omni-directionally. At an elevated temperature, nitrogen diffuses into deep regions of the surface, forming a thick layer of hard nitrides. Consequently, a long-lasting, wear-resistant surface is developed. Also, this method allows the treatment of a large quantity of devices simultaneously. The method of this invention provides a superior process with high product yield, at much lower cost than ion beam implantation.

In addition to the advantages of simplicity, and high yield, our process also uses relatively low voltages. Ion beam implantation requires tens of kilovolts to hundreds of kilovolts to accelerate ions into the surfaces of work-pieces. Such energy capacity requires expensive power supplies that must be safely insulated in (sometimes) cubicle size enclosures. An added safety/cost issue is the generation of X-rays as byproducts of high energy implantation (in excess of 15 kV). Because we utilize a low-energy intensive plasma in which the work-pieces are immersed, the power supply inventory is physically smaller, and no X-rays are generated as by-products.

DETAILED DESCRIPTION OF THE INVENTION

Figure 1:
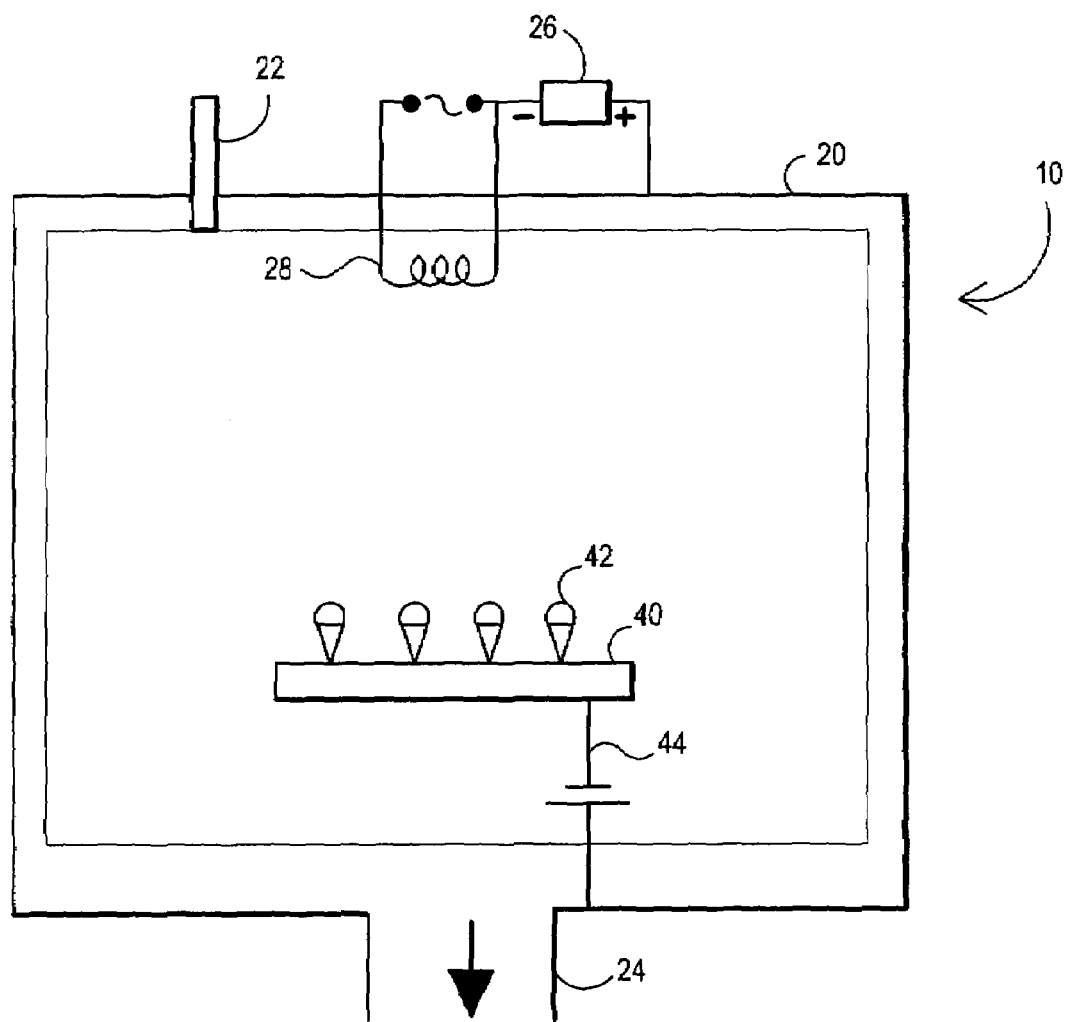
FIG. 1 illustrates a schematic drawing of a representative high intensity plasma ion nitriding apparatus of this invention.

A representative depiction of the method is illustrated in FIG. 1. In FIG. 1, a high intensity plasma ion nitriding (HIPIN) system is employed to accomplish the nitriding of biomedical materials for prosthetic devices, such as but not limited to devices made of Ti-6Al-4V and CoCrMo. The method can also be used to treat devices or parts other than biomedical materials or for prosthetic devices. For example, the method can be used to provide a nitride coating on a variety of devices and parts of devices that would benefit from having increased resistance to wear.

In FIG. 1, the system 10 includes a vacuum chamber 20. The vacuum chamber 20 can be made from a variety of materials and may be in a variety of three dimensional shapes and sizes. For example, the chamber can be made of metals and alloys that conduct electricity, including but not limited to steel, aluminum, iron, stainless steel, copper, and so on. The vacuum chamber 20 can have a variety of shapes including shapes having a square, rectangular, triangular, and square base, and so on. Since the vacuum chamber 20 is under a vacuum during the practice of this invention, the type of material and its thickness should be effective to enable the vacuum chamber 20 to retain its shape while under vacuum. In addition, the material should conduct electricity, or at least the inner surface (if more than on layer is used to form the chamber). The vacuum chamber 20 may be made of one or more materials and may have one or more layers. The chamber may optionally be thermally insulated.

The vacuum chamber 20 includes a nitrogen inlet 22. More than one nitrogen inlet 22 can be employed in a vacuum chamber 20. The nitrogen inlet 22 is connected to a source of nitrogen, not shown. The nitrogen inlet 22 can be connected directly to a nitrogen source, such as a high pressure nitrogen canister, directly via tubing, for example, or may optionally be indirectly connected to a nitrogen source through one or more valves or a valve manifold. It should be appreciated that the source of nitrogen can be pure nitrogen or can be a mixture of nitrogen with another gas. If a gas other than nitrogen is used in combination with the nitrogen, the other gas can be introduced into the vacuum chamber 20 in a separate inlet or through the nitrogen inlet 22. If a gas other than nitrogen is used, a mixture of nitrogen and the other gas, or gasses, is introduced via the nitrogen inlet 22. The nitrogen inlet is depicted in FIG. 1 at the top of the vacuum chamber 20; however, the nitrogen inlet can be positioned at other points of the vacuum chamber 20. Also, the size of the opening for the nitrogen inlet can vary.

The vacuum chamber also includes a vacuum line 24 that extends to a vacuum source, not shown, such as a vacuum pump. One or more vacuum lines 24 can be used. Similarly, more than one vacuum pumps can be used to reduce the pressure in the vacuum chamber 20. In FIG. 1, the vacuum line 24 is depicted at the bottom of the chamber and under the worktable 40; however, the vacuum line(s) can be positioned at other locations of the vacuum chamber 20. Similarly, the size of the opening for the vacuum line can vary. The source of vacuum is capable of providing a vacuum in the chamber prior to processing of below $10^{-5}$ Torr, preferably below $10^{-6}$ Torr. After introduction of the nitrogen, the pressure is maintained in the range of 0.01 to 10 milli-Torr. Conventional vacuum pumps designed for this purpose can be used in the practice of this invention.

The vacuum chamber includes a power supply 26 that provides power to an electron source 28 that generates electrons within the vacuum chamber 20. The power supply 26 is typically an alternating current (AC) power supply. In one embodiment, the electron source 28 may include a filament within the vacuum chamber 20. During operation, after the filament 28 heats up due to for example an AC current, the filament 28 emits electrons into the vacuum chamber. The purpose of the discharge power supply 26, which produces electrons within the chamber via the electron source 28, is to generate a plasma (ions and electrons) through electron neutral impact ionization. The worktable 40 is biased negatively to draw ions out of the plasma.

During use, a voltage may be applied between the electron source 28 and the vacuum chamber 20, which causes electrons to be drawn to the walls of the chamber. For example, in one embodiment, a DC voltage, such as in the range of 30-150 volts, may be applied between the electron source and the chamber, thereby drawing electrons to the chamber wall. The electrons collide with nitrogen and thereby create positively charged nitrogen ($N_2^+$ and $N^+$).

A worktable 40 is situated within the vacuum chamber 20. The devices 42 to be treated are placed on the worktable 40. The worktable can have one or more surfaces, such as having more than one shelf or stage on which to place devices to be treated. The worktable 40 can be made from a variety of electrically conductive materials, such as those used to make the vacuum chamber 20. The worktable 40 can be made in a variety of shapes and sizes. The worktable 40 may hold one or a plurality of devices 42 to be treated. The worktable is connected to a line 44 that supplies a negative bias voltage to the worktable 40 from a power source, which is not shown. In one embodiment, the worktable is biased to have a potential in the range of, for example, 100 to 2,000 volts. By placing a negative bias on the worktable during the practice of this invention, positively charged nitrogen ions will be accelerated toward the worktable and the devices to be nitrided. The negative bias can be supplied by a direct current (DC). As the ions drawn from the plasma bombard the devices, the temperature will rise. Typically, the temperature is monitored and, by adjusting the bias or current to the worktable and devices, maintained in a range from about 500 to about 1000 degrees Centigrade, more typically from about 600 to 900 degrees Centigrade, and in one embodiment from about 700 to 900 degrees Centigrade, and in one specific embodiment about 800 degrees Centigrade. It should be appreciated that plasma generation can be formed using discharge power, ion extraction, ion energy selection, and temperature control. The temperature can be measured using conventional components. Similarly, the negative bias voltage of the worktable can be automatically adjusted to maintain a given temperature using conventional components.

The biomedical devices 42 to be treated can be formed from a variety of materials or combination of materials. For example, the devices can be made of titanium, titanium alloy, or cobalt alloy. More particularly, the devices to be treated can be made of Ti-6Al-4V alloy, $Ti_6Al_7Nb$, commercially pure titanium, CoCrMo alloy, and so on. For example, the biomedical devices can be in the form of knee and hip implants, as is known to one of skill in the art. The biomedical devices can be pre-treated or post-treatment treated, such as by cleaning and so forth, according to conventional methods.

During use, after the vacuum chamber 20 is pumped down to a base pressure (such as below $10^{-5}$ Torr). Nitrogen ($N_2$) gas (or mixture of Ar, $N_2$, $H_2$ or $NH_3$) is then admitted into the chamber 20 to a working pressure (preferably about 0.01 to about 10 milli-Torr). Next, an electron source 28, such as a hot filament, is turned on so that electrons are generated. When a DC voltage, such as in the range of 30-150 V, is applied between the electron source and the chamber, electrons will be drawn to the chamber wall. Due to the electron-gas collisions, ionization of nitrogen occurs and plasma forms. If a negative bias voltage, such as at about 100-2000 V, is applied to the worktable 40 on which the biomedical devices 42 are placed in the plasma, nitrogen ions will be accelerated toward to the components. Due to the ion bombardment, the temperature of the components will increase. Once the temperature of the worktable reaches the set point, for instance about 800 degrees Centigrade, the bias voltage or the current to the worktable 40 is adjusted to maintain the temperature at the set point. At this pressure (0.01-10 milli-Torr) most nitrogen ions are in the form of molecules, $N_2^+$. While not wishing to be bound by theory, it is believed that when they impact the surface, the nitrogen ions will split into two atomic ions and subsequently are implanted into the surface to less than a few nanometers. At the nitriding temperature, the embedded atomic nitrogen diffuses rapidly to the deep regions of the components. The implanted nitrogen in the surface will often form nitrides, which are very hard. In general, the nitrogen ions impact the biomedical devices omnidirectionally. As a result, the surface resistance to wear is increased.

Since the process of this invention utilizes thermal diffusion, the nitrided layer (a few μm) is much deeper than that formed by ion implantation, which is a physical process and only generates about 0.1-0.2 μm. This deep nitrided layer generated using the HIPIN process of this invention permits improved, long wear lifetime. This process is also different from conventional ion (or plasma) nitriding. In conventional nitriding, a high pressure in the range of a few Torr is typically used. While not wishing to be bound by theory, the inventors theorize that at this pressure, ions suffer from many collisions before they can reach the work pieces, where-upon they lose their energy substantially. As a result, no implantation is accomplished. To achieve nitrogen diffusion, conventional ion/plasma nitriding relies on molecular nitrogen adsorption and dissociation into atomic nitrogen at the surface, and then diffusion into the surface. Compared to the HIPIN process of this invention, conventional nitriding produces much thinner nitrided layers, when the same nitriding temperature and duration are used.

EXAMPLES

Using the apparatus and process of this invention, a deep nitrided layer of about 3-4 microns was observed on the sample treated in accordance with this invention. Thick nitrided layer results in durable wear resistance.

Wear tests were conducted using various treatments. All the tests were conducted using a pin-on-disc tribolmeter using a ceramic ball of 0.5 inch in diameter and under two loads of 5 and 100 grams. It is understood that the smaller the wear track, the higher the wear resistance.

Wear resistance of Ti-6Al-4V treated under various conditions after 10,000 cycles of test using loads of 5 grams and 100 grams was measured. The wear track widths in millimeters were as follows using a 5 gram load: untreated (as a control), 0.5361; N-implanted (for comparison), 0.3939; nitrided at 650 C., 0.4499; nitrided at 750 C., 0.1655; and nitrided at 850 C., 0.04895. The wear track widths in millimeters were as follows using a 100 gram load: untreated (as a control), 1.177; N-implanted (for comparison), 1.184; nitrided at 650 C., 1.089; nitrided at 750 C., 0.951; and nitrided at 850 C., 0.1538. In view of the foregoing, the temperature during the nitriding process for a titanium biomedical devices is preferably at least about 650 C., in one embodiment at least about 700 C., in one embodiment at least about 750 C., in one embodiment at least about 800 C., and in one embodiment is at least about 850 C. As used herein, the temperature refers to the temperature of the worktable. The devices to be nitrided will have a temperature approximately the same as the worktable. In general, the temperature is less than about 1000.

Clearly, nitrogen implantation improves wear over the untreated material, but treatment according to this invention surpasses ion implantation.

In comparative experiments, cross-sectional SEM images of Ti-6Al-4V alloy samples prepared using nitrogen implanted and using the process of this invention. While the process of this invention produced thick nitride layer, no nitrided layer was observed from nitrogen implantation.

Cross-sectional SEM images were also obtained of CoCrMo samples treated using conventional nitrogen implantation and treated in accordance with this invention. Similar to Ti-6Al-4V, a thick nitrided layer was observed when using the process of this invention but not for the CoCrMo treated with conventional nitrogen implantation. Again the wear resistance of the samples treated in accordance with this invention was much higher than that for the nitrogen implantation. In particular, wear resistance of CoCrMo treated under various conditions after 10,000 cycles of test using a load of 100 grams was measured. The wear track widths in millimeters were as follows: untreated (as a control), 0.47; N-implanted (for comparison), 0.25; nitrided at 300 C., 0.12; nitrided at 400 C., 0.125; and nitrided at 700 C., 0.04; and nitrided at 800 C., 0.105. In view of the foregoing, the temperature during the nitriding process for cobalt containing materials is preferably at least about 300 C., in one embodiment at least about 400 C., in one embodiment about 700 C., and in one embodiment in the range from about 650 C. to about 750 C. In general, the temperature is less than about 1000 C.

What is claimed is:

1. A method of forming a nitride layer on at least one metal or metal alloy biomedical device, comprising: providing a vacuum chamber having a wall with at least one biomedical device positioned thereon on a worktable within the vacuum chamber; reducing the pressure in the vacuum chamber; introducing nitrogen into the vacuum chamber so that the pressure in the vacuum chamber is about 0.01 to about 10 milli-Torr; generating electrons from a device comprising an electron source within the vacuum chamber to form positively charged nitrogen ions; providing a voltage between said electron source and the vacuum chamber wall, said voltage configured to draw electrons toward said chamber wall; providing a negative bias to the worktable so that the positively charged nitrogen ions contact the biomedical devices under conditions such that a nitride layer forms on the at least one biomedical device.

2. The method of claim 1, wherein the biomedical device is made of Ti-6Al-4V alloy, $Ti_6Al_7Nb$, commercially pure titanium, or CoCrMo alloy.

3. The method of claim 1, wherein the bias of the worktable is maintained to provide a temperature of about 700 and about 900 degrees Centigrade.

4. The method of claim 1, wherein the nitride layer has a thickness of at least about 1 micron.

5. The method of claim 1, wherein the worktable has a negative bias voltage of about 100 to about 2000 volts.

6. The method of claim 1, wherein the electrons are generated using a filament.

7. The method of claim 1, wherein the vacuum chamber is reduced to a pressure of less than $10^{-5}$ Torr prior to introduction of the nitrogen.

8. The method of claim 1, wherein nitrogen and another gas are introduced into the vacuum chamber.

9. The method of claim 1, wherein the nitride layer has a thickness of about 1 to about 4 microns.

10. The method of claim 1, wherein the nitride layer has a thickness of about 3 to about 4 microns.

11. The method of claim 1, wherein the nitrogen ions impact the biomedical devices omnidirectionally.

12. The method of claim 1 wherein the temperature of the worktable is at least about 300 degrees Centigrade.

13. The method of claim 1, wherein the biomedical device contains titanium.

14. The method of claim 13, wherein the temperature of the worktable is at least about 800 degrees Centigrade.

15. The method of claim 1, wherein the biomedical device contains cobalt.

16. The method of claim 1, wherein the temperature of the worktable is at least about 650 to about 750 degrees Centigrade.

17. The method of claim 1, wherein the pressure is reduced to less than $10^{-6}$ Torr prior to introduction of the nitrogen.

18. The method of claim 1, wherein the electrons are generated using a alternating current power supply.

19. The method of claim 1, wherein the worktable is biased using a direct current power supply.

20. The method of claim 1, wherein said voltage between said electron source and the vacuum chamber is in the range of 30 to 150 volts.

* * * * *